United States Patent
Ono et al.

(10) Patent No.: US 9,647,465 B2
(45) Date of Patent: May 9, 2017

(54) CHARGE AND DISCHARGE CONTROL CIRCUIT AND BATTERY DEVICE

(71) Applicant: Seiko Instruments Inc., Chiba-shi, Chiba (JP)

(72) Inventors: Takashi Ono, Chiba (JP); Toshiyuki Koike, Chiba (JP); Satoshi Abe, Chiba (JP); Fumihiko Maetani, Chiba (JP)

(73) Assignee: SII Semiconductor Corporation (JP)

( * ) Notice: Subject to any disclaimer, the term of this patent is extended or adjusted under 35 U.S.C. 154(b) by 139 days.

(21) Appl. No.: 14/711,343

(22) Filed: May 13, 2015

(65) Prior Publication Data
US 2015/0333546 A1 Nov. 19, 2015

(30) Foreign Application Priority Data
May 14, 2014 (JP) .................................. 2014-100195

(51) Int. Cl.
*H02J 7/00* (2006.01)
*G01R 31/36* (2006.01)
*G01R 31/02* (2006.01)

(52) U.S. Cl.
CPC .............. *H02J 7/00* (2013.01); *G01R 31/025* (2013.01); *G01R 31/3606* (2013.01); *H02J 7/0029* (2013.01); *H02J 7/0063* (2013.01); *H02J 7/0072* (2013.01); *H02J 7/0077* (2013.01); *H02J 2007/0039* (2013.01); *H02J 2007/0067* (2013.01)

(58) Field of Classification Search
USPC ................ 320/236, 127, 128, 134, 135, 137
See application file for complete search history.

(56) References Cited

U.S. PATENT DOCUMENTS

| | | | | |
|---|---|---|---|---|
| 5,742,148 | A * | 4/1998 | Sudo ...................... | H02J 7/0011 320/118 |
| 5,789,902 | A * | 8/1998 | Abe ....................... | H02J 7/0031 320/134 |
| 5,936,384 | A | 8/1999 | Fujiwara | |
| 6,242,890 | B1 * | 6/2001 | Sudo ...................... | H02J 7/0063 320/127 |
| 6,316,915 | B1 | 11/2001 | Fujiwara et al. | |

(Continued)

FOREIGN PATENT DOCUMENTS

JP    2004-104956 A    4/2004

*Primary Examiner* — Brian Ngo
(74) *Attorney, Agent, or Firm* — Brinks Gilson & Lione

(57) ABSTRACT

A short-circuit and overcurrent detecting circuit includes a reference voltage circuit including a constant current circuit, a first impedance element, a first transistor having a resistance value depending a voltage of a secondary battery, a second impedance element, and a second transistor having a resistance value depending the voltage of the secondary battery, which are connected in series. The reference voltage circuit outputs a first reference voltage from a node of the constant current circuit and the first impedance element, and outputs a second reference voltage from a node of the first transistor and the second impedance element. The short-circuit and overcurrent detecting circuit further includes: a first comparator circuit for comparing a voltage of an overcurrent detecting terminal with the first reference voltage; and a second comparator circuit for comparing the voltage of the overcurrent detecting terminal with the second reference voltage.

4 Claims, 4 Drawing Sheets

(56) References Cited

U.S. PATENT DOCUMENTS

| | | | | |
|---|---|---|---|---|
| 6,331,763 B1 | * | 12/2001 | Thomas | H02H 9/042 320/136 |
| 6,879,133 B1 | * | 4/2005 | Geren | H02J 7/0031 320/134 |
| 2002/0050806 A1 | * | 5/2002 | Fujiwara | H02J 7/0031 320/136 |
| 2002/0079869 A1 | | 6/2002 | Fujiwara | |
| 2008/0018304 A1 | * | 1/2008 | Litingtun | H02J 7/0031 320/134 |
| 2008/0036422 A1 | * | 2/2008 | Sakurai | H02J 7/0031 320/134 |
| 2009/0102435 A1 | * | 4/2009 | Iwasaki | H02M 3/33523 320/166 |
| 2009/0121683 A1 | | 5/2009 | Goto | |
| 2009/0315515 A1 | * | 12/2009 | Yu | H02J 7/0016 320/116 |
| 2010/0090652 A1 | | 4/2010 | Takeda et al. | |
| 2010/0201327 A1 | | 8/2010 | Takeda | |
| 2012/0229945 A1 | | 9/2012 | Sakurai et al. | |
| 2013/0049779 A1 | * | 2/2013 | Berkhout | G01R 31/275 324/750.01 |
| 2013/0187615 A1 | | 7/2013 | Kimura | |
| 2013/0200847 A1 | * | 8/2013 | Kurokawa | H02J 7/0031 320/112 |
| 2013/0229144 A1 | * | 9/2013 | Nagata | H02J 7/0072 320/107 |
| 2014/0139143 A1 | * | 5/2014 | Navabi-Shirazi | H05B 33/0887 315/310 |
| 2014/0239909 A1 | * | 8/2014 | Watanabe | H02J 7/0029 320/134 |
| 2014/0253044 A1 | * | 9/2014 | Maetani | H02H 7/18 320/134 |

* cited by examiner

CHARGE AND DISCHARGE CONTROL CIRCUIT AND BATTERY DEVICE

RELATED APPLICATIONS

This application claims priority under 35 U.S.C. §119 to Japanese Patent Application No. 2014-100195 filed on May 14, 2014, the entire contents of which are hereby incorporated by reference.

BACKGROUND OF THE INVENTION

1. Field of the Invention

The present invention relates to a battery device including a secondary battery and a charge and discharge control circuit configured to detect a voltage and abnormality of the secondary battery to control charge and discharge of the secondary battery, and more particularly, to a charge and discharge control circuit and a battery device that are capable of preventing a battery from entering an abnormal state or preventing an excessive current from flowing through a battery or an apparatus connected to the battery.

2. Description of the Related Art

FIG. 4 is a circuit diagram illustrating a related-art battery device including a charge and discharge control circuit. The related-art battery device including the charge and discharge control circuit includes a secondary battery 11, an N-channel discharge control field effect transistor 12, an N-channel charge control field effect transistor 13, a charge and discharge control circuit 14, resistors 22 and 31, a capacitor 32, and external terminals 20 and 21. The charge and discharge control circuit 14 includes a control circuit 15, an overcurrent detecting circuit 530, a short-circuit detecting circuit 540, an overcurrent detecting terminal 19, a charge control signal output terminal 41, a discharge control signal output terminal 42, a DS terminal 45, a positive electrode power supply terminal 44, and a negative electrode power supply terminal 43. The overcurrent detecting circuit 530 includes a comparator circuit 101 and a reference voltage circuit 531. The short-circuit detecting circuit 540 includes a comparator circuit 102 and a reference voltage circuit 541.

The control circuit 15 includes resistors 504, 505, 506, 507, 518, and 528, reference voltage circuits 509 and 515, comparator circuits 501, 508, and 513, an oscillator circuit 502, a counter circuit 503, a logic circuit 510, a level shift circuit 511, a delay circuit 512, a logic circuit 520, and NMOS transistors 517 and 519.

Next, an operation of the related-art battery device including the charge and discharge control circuit is described. When a load is connected between the external terminals 20 and 21 and a current flows, a potential difference is generated between a negative electrode of the secondary battery 11 and the external terminal 21. This potential difference is determined based on a current amount $I_1$ flowing between the external terminals 20 and 21, a resistance value $R_{12}$ of the N-channel discharge control field effect transistor 12, and a resistance value $R_{13}$ of the N-channel charge control field effect transistor 13, and is represented by $I_1 \times (R_{12}+R_{13})$. A voltage of the overcurrent detecting terminal 19 is equal to a voltage of the external terminal 21. The comparator circuit 101 compares a voltage of the reference voltage circuit 531 with the voltage of the overcurrent detecting terminal 19. When the voltage of the overcurrent detecting terminal 19 is higher, the N-channel discharge control field effect transistor 12 is turned off for overcurrent protection. A setting value of an overcurrent detection current value is represented by $I_{DOP}$, a voltage of the reference voltage circuit 531 is represented by $V_{531}$, a resistance value of the N-channel discharge control field effect transistor 12 is represented by $R_{12}$, and a resistance value of the N-channel charge control field effect transistor 13 is represented by $R_{13}$. A voltage of the external terminal 21 as a threshold voltage for the comparator circuit 101 to output a detection signal is $V_{531}$. At this time, the current flowing between the external terminals 20 and 21 is obtained by dividing the voltage of the external terminal 21 by the sum of the resistance values of the N-channel discharge control field effect transistor 12 and the N-channel charge control field effect transistor 13, and is represented by $I_{DOP}=V_{531}/(R_{12}+R_{13})$.

A voltage of the overcurrent detecting terminal of the charge and discharge control circuit as a threshold voltage for the comparator circuit 101 to output a detection signal is referred to as "overcurrent detection voltage". A voltage of the overcurrent detecting terminal of the charge and discharge control circuit as a threshold voltage for the comparator circuit 102 to output a detection signal is referred to as "short-circuit detection voltage".

However, in the related art, the overcurrent detection voltage and the short-circuit detection voltage of the charge and discharge control circuit have constant values even when the secondary battery voltage or temperature changes, but the resistance value of the N-channel charge and discharge control field effect transistor changes along with a change in the secondary battery voltage or temperature, resulting in fluctuations in an overcurrent detection current value and a short-circuit detection current value. Accordingly, there is a problem in that the overcurrent detection current value and the short-circuit detection current value are low in accuracy to reduce the safety of the battery device. Further, there is another problem in that current consumption is high because two reference voltage circuits are used for the overcurrent detecting circuit and the short-circuit detecting circuit.

SUMMARY OF THE INVENTION

The present invention has been made to solve the above-mentioned problems, and aims at changing an overcurrent detection voltage and a short-circuit detection voltage of a charge and discharge control circuit so as to follow a change in a resistance value of an N-channel charge and discharge control field effect transistor caused by a change in a secondary battery voltage or temperature, to thereby prevent an overcurrent detection current value from being fluctuated by the change in the secondary battery voltage or temperature. Accordingly, the present invention provides a highly safe battery device in which the accuracy of the overcurrent detection current value and a short-circuit detection current value is improved with low current consumption.

In order to solve the related-art problems, a charge and discharge control circuit according to one embodiment of the present invention has the following configuration.

A short-circuit and overcurrent detecting circuit includes: a reference voltage circuit including a constant current circuit, a first impedance element, a first transistor having a resistance value that is changed depending on a voltage of a secondary battery, a second impedance element, and a second transistor having a resistance value that is changed depending on the voltage of the secondary battery, which are connected in series, the reference voltage circuit being configured to output a first reference voltage from a node of the constant current circuit and the first impedance element, and output a second reference voltage from a node of the first transistor and the second impedance element; a first comparator circuit configured to compare a voltage of an overcurrent detecting terminal with the first reference voltage; and a second comparator circuit configured to compare the voltage of the overcurrent detecting terminal with the second reference voltage.

According to the one embodiment of the present invention, a secondary battery voltage dependence and a temperature dependence of an overcurrent detection voltage and a short-circuit detection voltage of the charge and discharge control circuit may be matched with a secondary battery voltage dependence and a temperature dependence of a resistance value of a charge and discharge control switch, and hence even when the secondary battery voltage or temperature changes, an overcurrent detection current value and a short-circuit detection current value of the battery device are constant. Consequently, a highly safe battery device in which the accuracy of the overcurrent detection current value and the short-circuit detection current value is improved with low current consumption may be provided.

DETAILED DESCRIPTION OF THE PREFERRED EMBODIMENTS

First Embodiment

Figure 1:
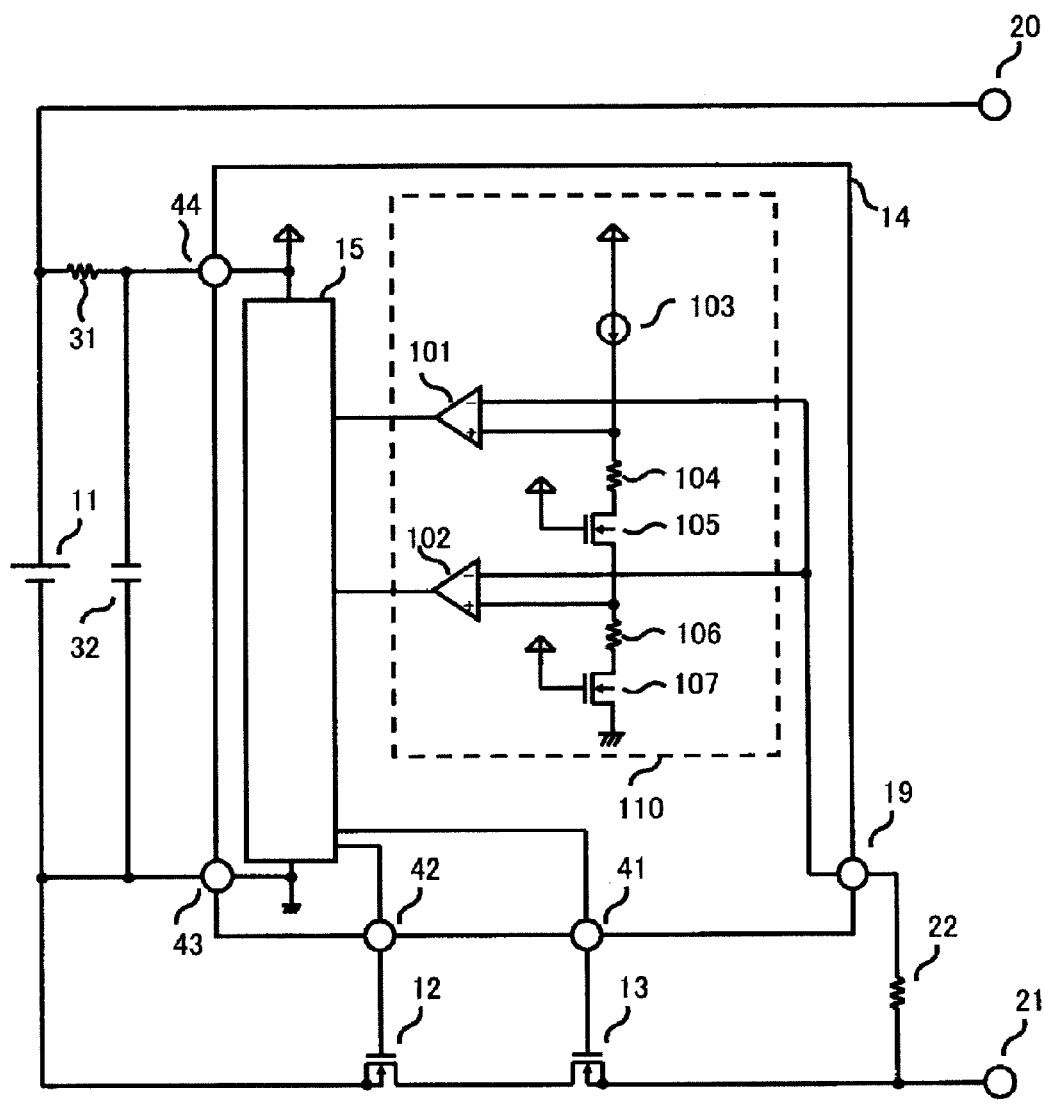
FIG. 1 is a circuit diagram of a charge and discharge control circuit and a battery device according to a first embodiment of the present invention.

FIG. 1 is a circuit diagram of a charge and discharge control circuit and a battery device according to a first embodiment of the present invention.

The charge and discharge control circuit and the battery device of the first embodiment include a secondary battery 11, an N-channel discharge control field effect transistor 12, an N-channel charge control field effect transistor 13, a charge and discharge control circuit 14, resistors 22 and 31, a capacitor 32, and external terminals 20 and 21. The charge and discharge control circuit 14 includes a control circuit 15, a short-circuit and overcurrent detecting circuit 110, an overcurrent detecting terminal 19, a charge control signal output terminal 41, a discharge control signal output terminal 42, a positive electrode power supply terminal 44, and a negative electrode power supply terminal 43. The short-circuit and overcurrent detecting circuit 110 includes comparator circuits 101 and 102, a constant current circuit 103, resistors 104 and 106, and NMOS transistors 105 and 107. The constant current circuit 103, the resistors 104 and 106, and the NMOS transistors 105 and 107 form a reference voltage circuit.

The secondary battery 11 has a positive electrode connected to the external terminal 20 and the resistor 31, and a negative electrode connected to the capacitor 32, the negative electrode power supply terminal 43, and a source and a back gate of the N-channel discharge control field effect transistor 12. The positive electrode power supply terminal 44 is connected to a node of the resistor 31 and the capacitor 32. The N-channel discharge control field effect transistor 12 has a gate connected to the discharge control signal output terminal 42, and a drain connected to a drain of the N-channel charge control field effect transistor 13. The N-channel charge control field effect transistor 13 has a gate connected to the charge control signal output terminal 41, and a source and a back gate connected to the external terminal 21 and one terminal of the resistor 22. The other terminal of the resistor 22 is connected to the overcurrent detecting terminal 19.

The comparator circuit 101 has an inverting input terminal connected to the overcurrent detecting terminal 19, a non-inverting input terminal connected to a node of one terminal of the constant current circuit 103 and one terminal of the resistor 104, and an output terminal connected to the control circuit 15. The other terminal of the constant current circuit 103 is connected to the positive electrode power supply terminal 44. The NMOS transistor 105 has a gate connected to the positive electrode power supply terminal 44, a drain connected to the other terminal of the resistor 104, and a source connected to one terminal of the resistor 106. The NMOS transistor 107 has a gate connected to the positive electrode power supply terminal 44, a drain connected to the other terminal of the resistor 106, and a source connected to the negative electrode power supply terminal 43. The comparator circuit 102 has an inverting input terminal connected to the overcurrent detecting terminal 19, a non-inverting input terminal connected to the source of the NMOS transistor 105, and an output terminal connected to the control circuit 15. The control circuit 15 has a power supply terminal connected to the positive electrode power supply terminal 44, a ground terminal connected to the negative electrode power supply terminal 43, a first output terminal connected to the discharge control signal output terminal 42, and a second output terminal connected to the charge control signal output terminal 41.

Next, an operation of the charge and discharge control circuit and the battery device of this embodiment is described. When the voltage of the secondary battery 11 is equal to or lower than an overcharge detection voltage and equal to or higher than an overdischarge detection voltage, the N-channel discharge control field effect transistor 12 and the N-channel charge control field effect transistor 13 are controlled to be turned on. When a load is connected between the external terminals 20 and 21 in this state and a discharge current is caused to flow, a potential difference is generated between the negative electrode of the secondary battery 11 and the external terminal 21. This potential difference is determined based on a current amount I1 flowing between the external terminals 20 and 21, a resistance value $R_{12}$ of the N-channel discharge control field effect transistor 12, and a resistance value $R_{13}$ of the N-channel charge control field effect transistor 13, and is represented by $I_1 \times (R_{12} + R_{13})$.

The constant current circuit 103 causes a current to flow through the resistors 104 and 106 and the NMOS transistors 105 and 107 to generate a voltage, and outputs the voltage as a reference voltage of the reference voltage circuit. The comparator circuit 102 compares the reference voltage of the reference voltage circuit with a voltage of the overcurrent detecting terminal 19. When the voltage of the overcurrent detecting terminal 19 is higher, the comparator circuit 102 outputs a detection signal to the control circuit 15 to turn off the N-channel discharge control field effect transistor 12 for overcurrent protection.

A setting value of an overcurrent detection current value is represented by $I_{DOP}$, a voltage generated at a node of the source of the NMOS transistor 105 and the resistor 106 of the reference voltage circuit is represented by $V_{ref}$, a resistance value of the N-channel discharge control field effect transistor 12 is represented by $R_{12}$, and a resistance value of the N-channel charge control field effect transistor 13 is represented by $R_{13}$. A voltage of the external terminal 21 as a threshold voltage for the comparator circuit 102 to output a detection signal is $V_{ref}$. At this time, the current flowing between the external terminals 20 and 21 is obtained by dividing the voltage of the external terminal 21 by the sum of the resistance values of the N-channel discharge control field effect transistor 12 and the N-channel charge control field effect transistor 13, and is represented by $I_{DOP}=V_{ref}/(R_{12}+R_{13})$.

In this case, the resistance value of the N-channel field effect transistors has a gate-source voltage dependence and a temperature dependence. A source potential of the N-channel charge and discharge control field effect transistors is a negative electrode potential of the secondary battery, and a gate potential thereof is a positive electrode potential of the secondary battery. Accordingly, the resistance value ($R_{12}$+$R_{13}$) of the N-channel charge and discharge control field effect transistors has a secondary battery voltage dependence and a temperature dependence.

The source of the NMOS transistor 107 is connected to the negative electrode power supply terminal 43 and the gate thereof is connected to the positive electrode power supply terminal 44, and hence the NMOS transistor 107 creates the state in which a gate-source voltage thereof is the same as that of the N-channel charge and discharge control field effect transistors.

When a length W and a length L of the NMOS transistor 107 are changed and an amount of current flowing into the NMOS transistor 107 is changed by the constant current circuit 103, a secondary battery voltage dependence of $V_{ref}$ can be adjusted. Further, in order to adjust the overcurrent detection current value $T_{DOP}$, which is represented by $V_{ref}/(R_{12}+R_{13})$, the absolute value of $V_{ref}$ needs to be calibrated. Through optimization of the value of the resistor 106 based on the current value of the constant current circuit 103 so that $V_{ref}$ is $I_{DOP}\times(R_{12}+R_{13})$, a target value of the overcurrent detection current is adjusted. Further, temperature characteristics of the resistor 106 can be adjusted by changing the method of manufacturing an element. When the absolute value of $V_{ref}$ is calibrated, the temperature characteristics of the resistor 106 need to be optimized so that temperature characteristics of $V_{ref}$ match with temperature characteristics of the N-channel charge and discharge control field effect transistors.

A setting value of a short-circuit detection current value is represented by $I_{SHORT}$, and a voltage generated at a node of the constant current circuit 103 and the resistor 104 of the reference voltage circuit is represented by $V_{ref2}$. A voltage of the external terminal 21 as a threshold voltage for the comparator circuit 101 to output a detection signal is $V_{ref2}$. At this time, the current flowing between the external terminals 20 and 21 is obtained by dividing the voltage of the external terminal 21 by the sum of the resistance values of the N-channel discharge control field effect transistor 12 and the N-channel charge control field effect transistor 13, and is represented by $I_{SHORT}=V_{ref2}/(R_{12}+R_{13})$.

Further, a potential difference $V\Delta$ generated between the resistor 104 and the NMOS transistor 105 is represented by $V\Delta=V_{ref2}-V_{ref}=(I_{SHORT}-I_{DOP})\times(R_{12}+R_{13})$.

In this case, the resistance value of the N-channel field effect transistors has a gate-source voltage dependence and a temperature dependence. A source potential of the N-channel charge and discharge control field effect transistors is a negative electrode potential of the secondary battery, and a gate potential thereof is a positive electrode potential of the secondary battery. Accordingly, the resistance value ($R_{12}$+$R_{13}$) of the N-channel charge and discharge control field effect transistors has a secondary battery voltage dependence and a temperature dependence. The source of the NMOS transistor 105 is connected to the resistor 106 and the gate thereof is connected to the positive electrode power supply terminal 44, and hence the NMOS transistor 105 creates the state in which a gate-source voltage thereof is the same as that of the N-channel charge and discharge control field effect transistors.

When a length W and a length L of the NMOS transistor 105 are changed and an amount of current flowing into the NMOS transistor 105 is changed by the constant current circuit 103, a secondary battery voltage dependence of $V\Delta$ can be adjusted. Further, in order to adjust the short-circuit detection current value $I_{SHORT}$, which is represented by $V\Delta/(R_{12}+R_{13})+I_{DOP}$, the absolute value of $V\Delta$ needs to be calibrated. Through optimization of the value of the resistor 104 based on the current value of the constant current circuit 103 so that $V\Delta$ is $(I_{SHORT}-I_{DOP})\times(R_{12}+R_{13})$, a target value of the short-circuit detection current is adjusted. Further, temperature characteristics of the resistor 104 can be adjusted by changing the method of manufacturing an element. When the absolute value of $V\Delta$ is calibrated, the temperature characteristics of the resistor 104 need to be optimized so that temperature characteristics of $V\Delta$ match with temperature characteristics of the N-channel charge and discharge control field effect transistors.

In this manner, the secondary battery voltage dependence and the temperature dependence of the value of the reference voltage of the reference voltage circuit can be adjusted so as to match with the secondary battery voltage dependence and the temperature dependence of the resistance value of the N-channel charge and discharge control field effect transistors. Consequently, the setting value $I_{DOP}$ of the overcurrent detection current value and the setting value $I_{SHORT}$ of the short-circuit detection current value can be maintained constant even when the secondary battery voltage or temperature changes. Further, the detection can be performed even without using a reference voltage circuit for short-circuit detection, and hence current consumption can be reduced.

Note that, the gates of the NMOS transistor 105 and the NMOS transistor 107 are connected to the positive electrode power supply terminal 42 of the charge and discharge control circuit 14, but the resistance value of the N-channel charge and discharge control field effect transistors only needs to be changed in response to detection of the secondary battery voltage, and hence the same effect as in the first embodiment can be exerted as long as the gates of the NMOS transistor 105 and the NMOS transistor 107 are connected to a circuit having a secondary battery voltage dependence and the constant current value is adjusted. Further, the N-channel discharge control field effect transistor 12, the N-channel charge control field effect transistor 13, and the NMOS transistor 105 are used in the description, but the present invention is not limited to this configuration. It is needless to say that, even when P-channel field effect transistors are used, the NMOS transistor 105 is changed to a PMOS transistor, and the constant current circuit 103 is connected to the negative electrode power supply terminal 43 instead of the positive electrode power supply terminal 44, a similar operation is enabled. Further, the resistor 104 and the resistor 106 are not limited to the configuration described above, and any impedance element may be used as long as the element has impedance.

As described above, the battery device of the first embodiment can match the secondary battery voltage dependence and the temperature dependence of the overcurrent detection voltage and the short-circuit detection voltage of the charge and discharge control circuit with the secondary battery voltage dependence and the temperature dependence of the N-channel charge and discharge control field effect transistors, to thereby improve the accuracy of the overcurrent detection current value and the short-circuit detection current value of the battery device and enhance the safety of the battery device. Further, current consumption can be reduced because a reference voltage circuit for short-circuit detection is not used.

Second Embodiment

Figure 2:
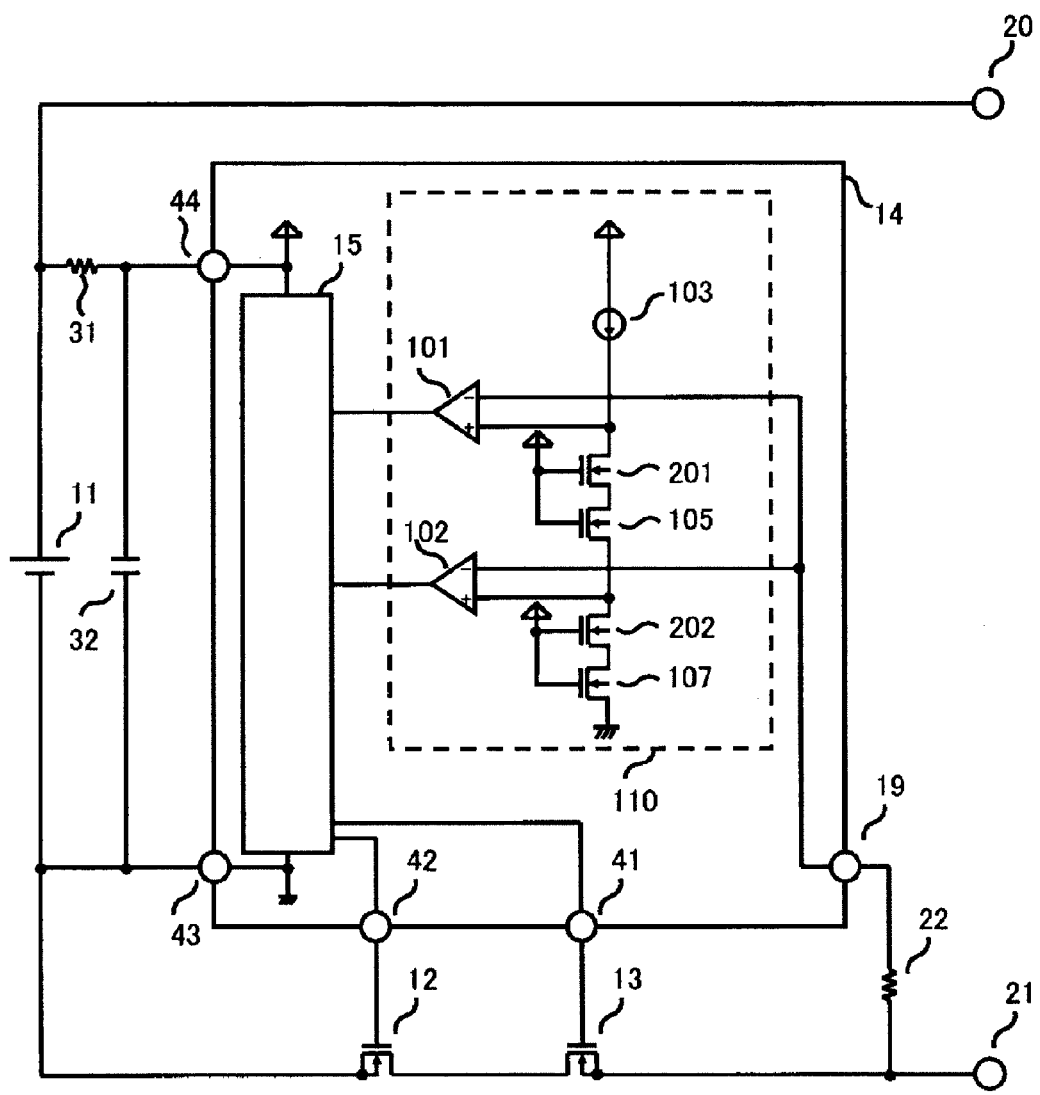
FIG. 2 is a circuit diagram of a charge and discharge control circuit and a battery device according to a second embodiment of the present invention.

FIG. 2 is a circuit diagram of a charge and discharge control circuit and a battery device according to a second embodiment of the present invention. The second embodiment differs from the first embodiment in that the resistors 104 and 106 are changed to NMOS transistors 201 and 202.

The NMOS transistor 201 has a gate connected to the positive electrode power supply terminal 44, a drain connected to the non-inverting input terminal of the comparator circuit 101, and a source connected to the drain of the NMOS transistor 105. The NMOS transistor 202 has a gate connected to the positive electrode power supply terminal 44, a drain connected to the non-inverting input terminal of the comparator circuit 102, and a source connected to the drain of the NMOS transistor 107. The remaining connection is similar to that in the first embodiment. Even with such a configuration, the setting value of the overcurrent detection current value and the setting value of the short-circuit detection current value can be maintained constant even when the secondary battery voltage or temperature changes.

Note that, in the case where the temperature characteristics are adjusted by the NMOS transistors 201 and 202, the method of manufacturing an element may be changed to adjust the temperature characteristics, such as the use of dual-gate transistors.

As described above, the battery device of the second embodiment can match the secondary battery voltage dependence and the temperature dependence of the overcurrent detection voltage and the short-circuit detection voltage of the charge and discharge control circuit with the secondary battery voltage dependence and the temperature dependence of the N-channel charge and discharge control field effect transistors, to thereby improve the accuracy of the overcurrent detection current value and the short-circuit detection current value of the battery device and enhance the safety of the battery device. Further, current consumption can be reduced because a reference voltage circuit for short-circuit detection is not used.

Third Embodiment

Figure 3:
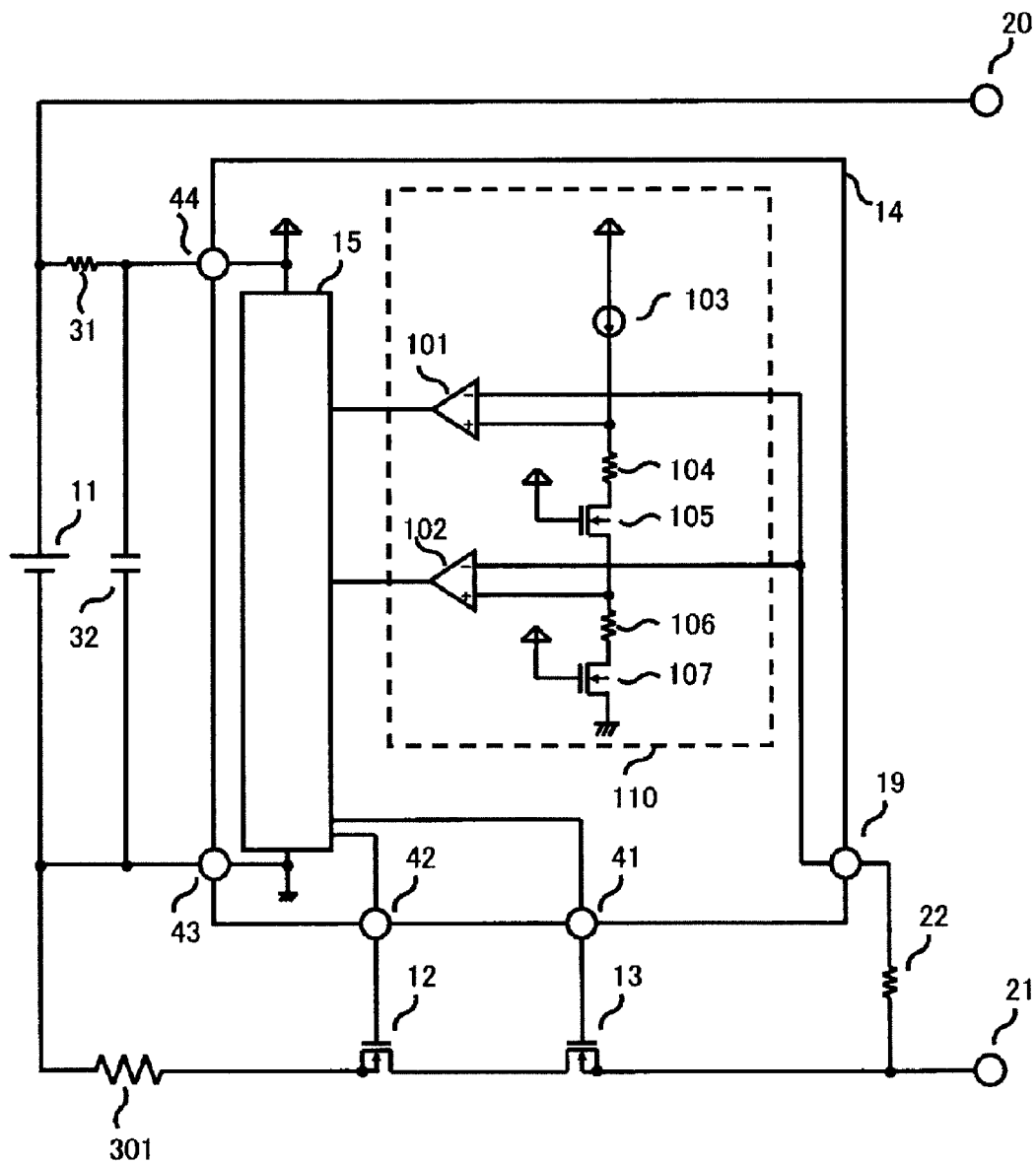
FIG. 3 is a circuit diagram of a charge and discharge control circuit and a battery device according to a third embodiment of the present invention.
Figure 4:
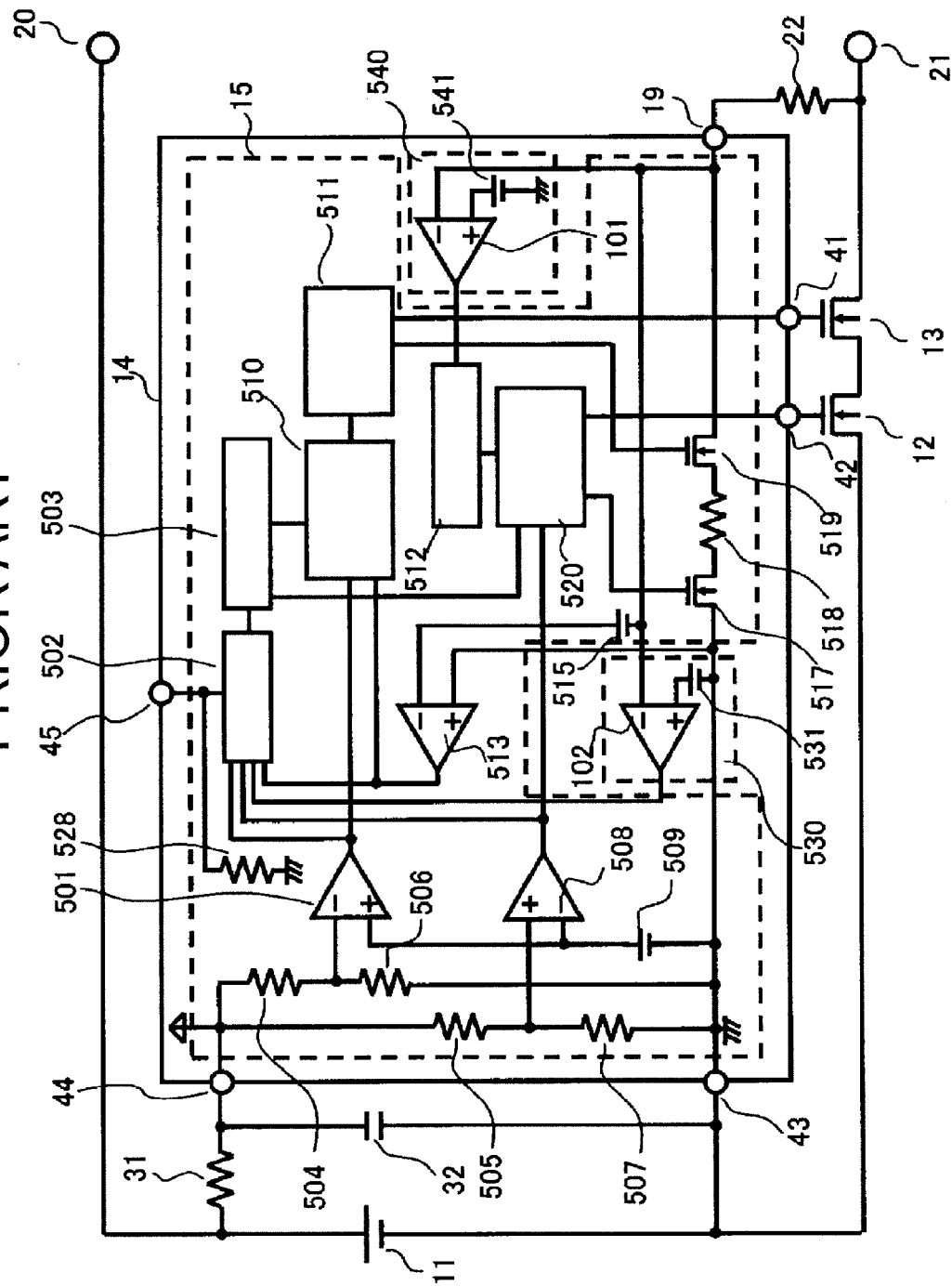
FIG. 4 is a circuit diagram of a charge and discharge control circuit and a battery device according to the related art.

FIG. 3 is a circuit diagram of a charge and discharge control circuit and a battery device according to a third embodiment of the present invention. The third embodiment differs from the battery device of the first embodiment in that a resistor 301 is added between a node of the negative electrode of the secondary battery 11 and the negative electrode power supply terminal 43 and the source of the N-channel discharge control field effect transistor 12. All the remaining connection is similar to that in the first embodiment.

An on-resistance $R_{12}$ of the N-channel discharge control field effect transistor 12 and an on-resistance $R_{13}$ of the N-channel charge control field effect transistor 13 greatly fluctuate in the manufacturing process and are low in accuracy. To deal with this, a resistor 33, which has less fluctuations in resistance value than the N-channel field effect transistors, is connected in series to the N-channel field effect transistors. In this manner, the fluctuations in overcurrent detection current value can be reduced. The operations of detecting the overcurrent and the short-circuit current are the same as in the first embodiment, and can be realized also by the configuration of FIG. 3.

Note that, the position of the resistor 301 is not limited to the position of FIG. 3, and the resistor 301 may be connected at any position between the node of the negative electrode of the secondary battery 11 and the negative electrode power supply terminal 43 and a node of the external terminal 21 and the resistor 22. Further, the resistor 301 may not be a resistor formed by design, and may be a parasitic resistor formed when the circuit is constructed. Further, the configuration of the third embodiment may be used not only for the configuration of the first embodiment but also for the configuration of the second embodiment.

As described above, the battery device of the third embodiment can match the secondary battery voltage dependence and the temperature dependence of the overcurrent detection voltage and the short-circuit detection voltage of the charge and discharge control circuit with the secondary battery voltage dependence and the temperature dependence of the N-channel charge and discharge control field effect transistors, to thereby improve the accuracy of the overcurrent detection current value and the short-circuit detection current value of the battery device and enhance the safety of the battery device. Further, current consumption can be reduced because a reference voltage circuit for short-circuit detection is not used.

What is claimed is:
1. A charge and discharge control circuit, comprising:
  a control circuit configured to detect a voltage and abnormality of a secondary battery; and
  a short-circuit and overcurrent detecting circuit configured to detect an overcurrent and a short circuit based on a voltage of an overcurrent detecting terminal,
  the short-circuit and overcurrent detecting circuit comprising:
    a reference voltage circuit comprising a constant current circuit, a first impedance element connected to the constant current circuit, a first transistor including a drain connected to the first impedance element, and having a resistance value that is changed depending on the voltage of the secondary battery, a second impedance element connected to a source of the first transistor, and a second transistor including a drain connected to the second impedance element, and having a resistance value that is changed depending on the voltage of the secondary battery, the reference voltage circuit being configured to output a first reference voltage from a node of the constant current circuit and the first impedance element, and output a second reference voltage from a node of the first transistor and the second impedance element;

a first comparator circuit configured to compare the voltage of the overcurrent detecting terminal with the first reference voltage; and a second comparator circuit configured to compare the voltage of the overcurrent detecting terminal with the second reference voltage.

2. A charge and discharge control circuit according to claim 1, wherein the first impedance element comprises a third transistor having a resistance value that is changed depending on the voltage of the secondary battery, and wherein the second impedance element comprises a fourth transistor having a resistance value that is changed depending on the voltage of the secondary battery.

3. A battery device, comprising:

a secondary battery;

a charge and discharge control switch connected in a charge and discharge path of the secondary battery; and the charge and discharge control circuit according to claim 1 configured to monitor a voltage of the secondary battery to control the charge and discharge control switch.

4. A battery device according to claim 3, further comprising a resistor connected in the charge and discharge path between the secondary battery and an external terminal, in which the charge and discharge control switch is connected.

* * * * *